United States Patent
Kim et al.

(10) Patent No.: US 6,888,366 B2
(45) Date of Patent: May 3, 2005

(54) APPARATUS AND METHOD FOR TESTING A PLURALITY OF SEMICONDUCTOR CHIPS

(75) Inventors: Hong-Beom Kim, Suwon (KR); Ho-Jin Park, Yongin (KR); Sung-Hwan In, Seoul (KR); Ha-Il Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/458,437

(22) Filed: Jun. 10, 2003

(65) Prior Publication Data

US 2004/0041579 A1 Mar. 4, 2004

(30) Foreign Application Priority Data

Aug. 29, 2002 (KR) ................................. 10-2002-0051598

(51) Int. Cl.[7] .............................................. G01R 31/26
(52) U.S. Cl. ........................ 324/765; 324/73.1; 714/724
(58) Field of Search ................................ 324/73.1, 754, 324/759, 763–765, 158.1; 714/718, 724, 729, 735–736, 738; 702/118–119

(56) References Cited

U.S. PATENT DOCUMENTS

| | | | | |
|---|---|---|---|---|
| 5,675,544 A | * | 10/1997 | Hashimoto | .................. 365/201 |
| 5,794,175 A | * | 8/1998 | Conner | ....................... 702/119 |
| 6,452,411 B1 | * | 9/2002 | Miller et al. | ................. 324/765 |
| 6,466,007 B1 | * | 10/2002 | Prazeres da Costa et al. | ... 324/158.1 |
| 6,480,978 B1 | * | 11/2002 | Roy et al. | .................... 714/724 |

* cited by examiner

Primary Examiner—Minh N. Tang
(74) Attorney, Agent, or Firm—F. Chau & Associates, LLC (57) ABSTRACT

A semiconductor chip test system and test method thereof are provided. The system having a plurality of data input/output pins, a tester for inputting/outputting data through the plurality of data input/output pins; a plurality of semiconductor chips to be tested by the tester; a control circuit for sequentially outputting the output data from each of the plurality of semiconductor chips to the tester during a read operation and simultaneously supplying the input data from the tester to the semiconductor chips during a write operation.

11 Claims, 11 Drawing Sheets

APPARATUS AND METHOD FOR TESTING A PLURALITY OF SEMICONDUCTOR CHIPS

BACKGROUND OF THE INVENTION

1. Field of the Invention

The present invention relates generally to a semiconductor chip test system, and more particularly, to a system and method for increasing a number of semiconductor chips to be tested in parallel.

2. Description of Related Art

A conventional semiconductor chip test system includes a tester, a probe card, and semiconductor chips to be tested.

The conventional semiconductor chip test system is limited by the number of the semiconductor chips capable of being tested in parallel. For example, if there are 64 input/output pins on the tester of the semiconductor chip test system, the test system can test only 8 semiconductor chips in parallel each of which have eight (8) input/output pins.

Figure 1:
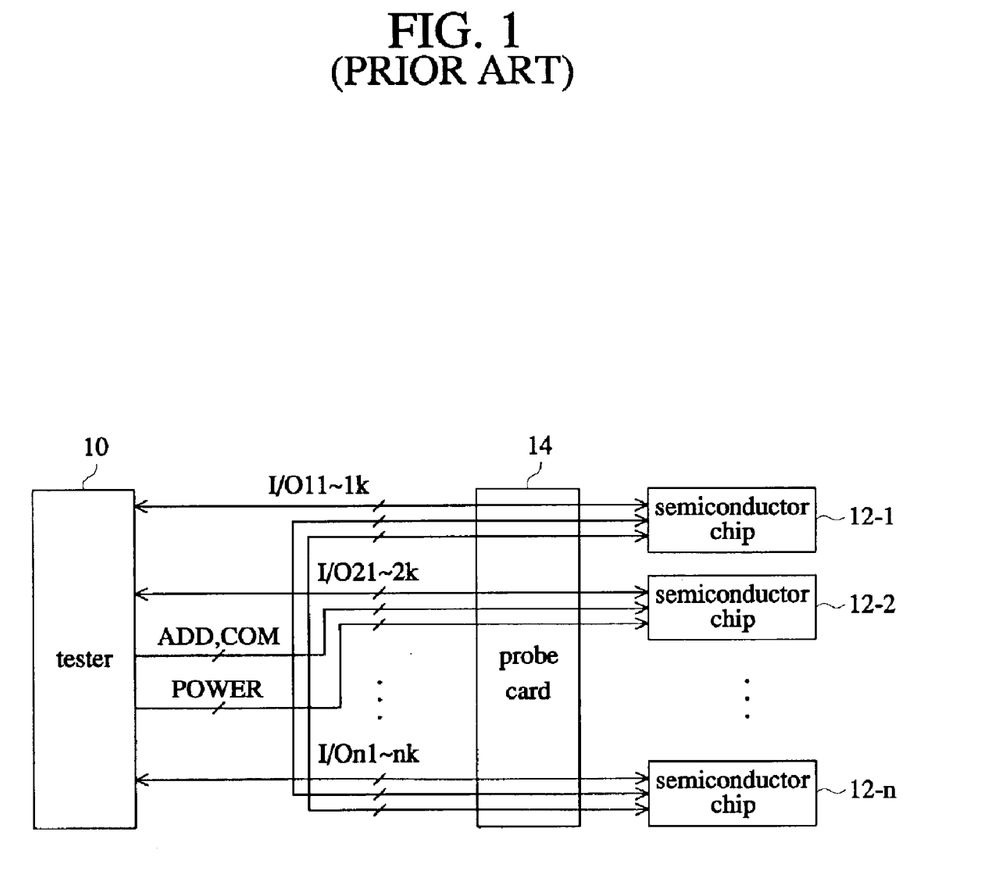
FIG. 1 shows a schematic block diagram of a conventional semiconductor chip test system.

FIG. 1 shows a schematic block diagram of the conventional semiconductor chip test system including the tester 10, semiconductor chips 12-1~12-n, and a probe card 14.

Symbols I/O11~1k, I/O21~2k, . . . , I/On1~nk are indicative of data input/output lines connected between data input/output pads (or, pins) of the semiconductor chips 12-1~12-n and data input/output pins (not shown) of the tester 10. Symbols ADD and COM are indicative of address and command input lines connected between address and command input pins (not shown) of the tester 10 and address and command input pads (or pins) (not shown) of the semiconductor chips 12-1~12-n. A symbol POWER is indicative of power supplying lines connected between power supply pins (not shown) of the tester 10 and power supplying pads (or pins) of the semiconductor chips 12-1~12-n.

The tester 10 inputs/outputs data from/to the semiconductor chips 12-1~12-n comprising k data input/output pads (or pins) through the data input/output lines I/O11~1k . . . I/On1~nk, outputs the address and the command to the semiconductor chips 12-1~12-n through the address and command output lines ADD and COM, and applies the power supply through the power supplying lines POWER. At this time, the data are transferred between the tester 10 and the semiconductor chips 12-1~12-n through the probe card 14. Also, the address, the command, and the power supply are applied from the tester 10 to the semiconductor chips 12-1~12-n through the probe card 14. When the semiconductor chips are tested at a wafer level, the tester 10 is connected to the data input/output pads of the chips. When the semiconductor chips are tested at a package level, the tester 10 is connected to the data input/output pins of the chips.

In the test system described above, there is no problem in that the address and the command output lines ADD and COM, and the power supplying lines POWER are commonly connected from the tester 10 to the n semiconductor chips 12-1~12-n. In other words, the tester 10 outputs a signal through the address and command output lines ADD and COM, and the power supplying lines POWER. The signal lines are configured to be in n groups and being connected to each of n semiconductor chips 12-1~12-n through the probe card 14.

However, n groups of the data input/output lines ((I/O11~I/O1k)~(I/On1~I/Onk)) of the tester 10 are not commonly connected to n semiconductor chips 12-1~12-n but are connected to each of n semiconductor chips 12-1~12-n, since data which is written from the tester to the semiconductor chips is same, but data which is read from the semiconductor chips to the tester can be different.

Accordingly, the conventional semiconductor chip test system can not commonly use the data input/output lines, and thus, if the number of the data input/output pads (or pins) of each of n semiconductors chips 12-1~12-n is k, the conventional semiconductor test system has to input/output the data through nk data input/output lines. As a result, the number of the semiconductor chips to be tested are limited to the number of the data input/output pins of the tester of the semiconductor chip test system.

SUMMARY OF THE INVENTION

A semiconductor chip test system capable of testing semiconductor chips even when the number of data input/output pads (or pins) of semiconductor chips to be tested is higher than a number of a data input/output pins of the tester of the semiconductor chip test system is provided.

According to one aspect of the present invention, a semiconductor chip test system comprises a tester having a plurality of data input/output pins for inputting/outputting data through the plurality of data input/output pins, a plurality of semiconductor chips to be tested by the tester, and a control circuit for sequentially outputting the data output from each of the plurality of semiconductor chips to the tester during a read operation and supplying the data input from the tester to the plurality of semiconductor chips during a write operation.

According to another aspect of the present invention, a semiconductor chip test system comprises a tester having n groups of data input/output pins of which each of the groups include k data input/output pins for inputting/outputting data through the plurality of data input/output pins, n groups of semiconductor chips, each group including m semiconductor chips, each semiconductor chip comprising k data input/output pads (or pins) to be tested by the tester, and a control means for sequentially outputting the data input from a first one to $m_{th}$ one of each of the n groups of semiconductor chips to the tester during a read operation and simultaneously supplying nk data output from the tester to the n groups of semiconductor chips during a write operation.

The control means comprises a clock signal generating means for generating a first clock signal in response to a rising edge of a clock signal input from the tester and generating a second clock signal in response to a falling edge of the clock signal input from the tester, a control signal generating means for generating a read command and a write command by inputting a command input from the tester, a read control signal generating means for sequentially generating m read control signals by inputting the read command in response to the second clock signal, a write control signal generating means for generating a write control signal in response to the write command, a read data control means for sequentially outputting the output data from a first semiconductor chip to the $m_{th}$ semiconductor chip of each of the n groups of semiconductor chips to the tester in response to the m read control signals, and a write data control means for simultaneously outputting the data input from the tester to the n groups of semiconductor chips in response to the write control signal.

According to a further aspect of the present invention, a test method of the semiconductor chip test system is provided, the system including a tester having n groups of data input/output pins of which each of the groups include k data input/output pins for inputting/outputting data through the data input/output pins, and n groups of semiconductor chips being respectively including m semiconductor chips, and each of the m semiconductor chips comprising k data input/output pads (or pins) to be tested by the tester, comprises steps of sequentially outputting the input data from a first semiconductor chip to $m_{th}$ semiconductor chip for each of the n groups of the semiconductor chips to the tester during a read operation and simultaneously supplying nk data output from the tester to the n groups of semiconductor chips during a write operation.

According to another aspect, the test method further comprises steps of generating a first clock signal in response to a rising edge of a clock signal input from the tester, generating a second clock signal in response to a falling edge of the clock signal from the tester, and generating a read command and a write command by inputting a command input from the tester, generating sequentially m read control signals by inputting the read command in response to the second clock signal, and generating a write control signal in response to the write command, and outputting sequentially output data from the first semiconductor chip to the $m_{th}$ semiconductor chip for each of the n groups of semiconductor chips to the tester in response to each of the m read control signals during the read operation and simultaneously outputting the data input from the tester to the n groups of semiconductor chips in response to the write control signal during the write operation.

Other aspects, features and advantages of the present invention are disclosed in a detailed description that follows.

BRIEF DESCRIPTION OF THE DRAWINGS

For a more complete understanding of the present invention and the advantages thereof, reference is now made to the following description taken in conjunction with the accompanying drawings, in which like reference numerals designate like elements, and in which.

DETAILED DESCRIPTION OF PREFERRED EMBODIMENTS

Embodiments of a semiconductor test system and method for testing the same according to the present invention will now be described with reference to the accompanying drawings.

Figure 2:
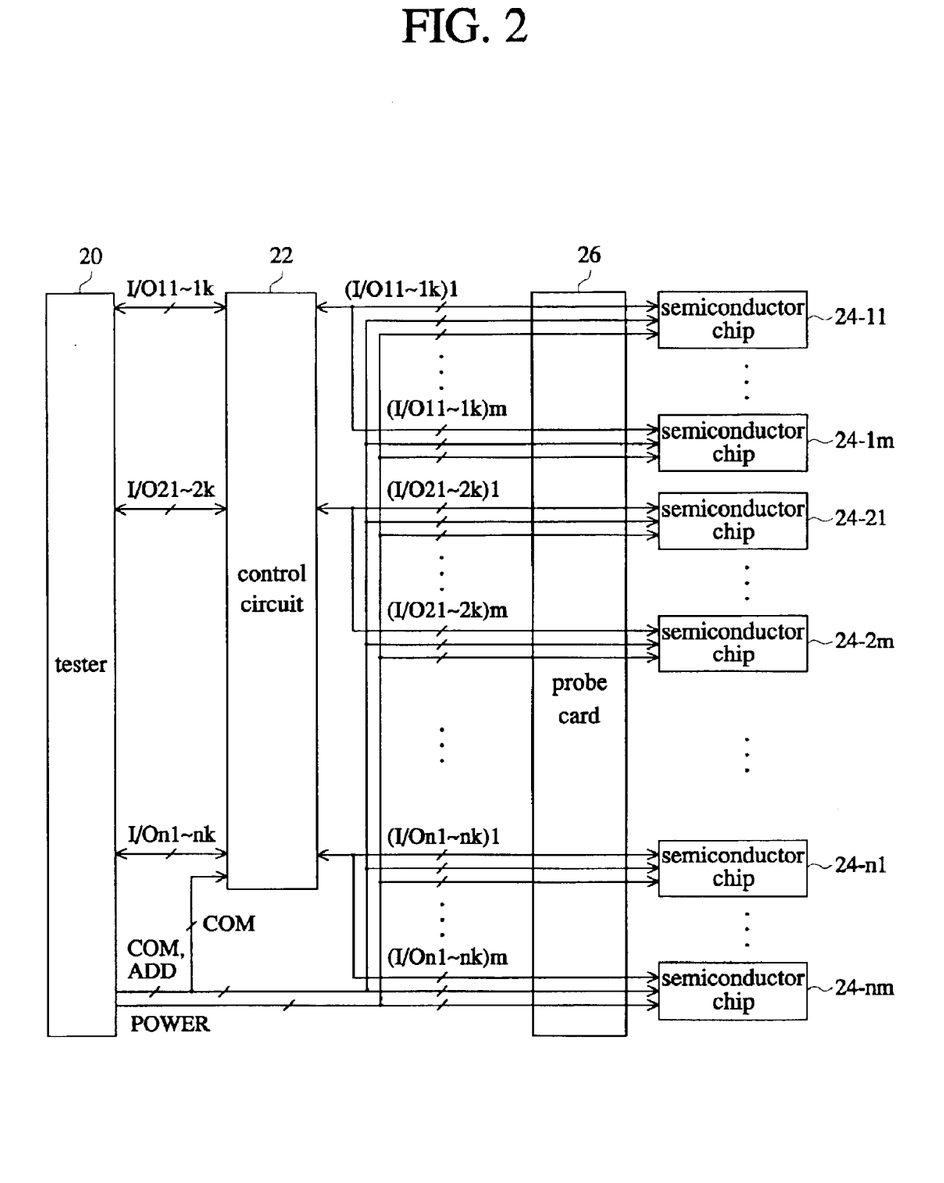
FIG. 2 is a block diagram illustrating an embodiment of a semiconductor chip test system in accordance with the present invention.

FIG. 2 is a block diagram illustrating an embodiment of a semiconductor chip test system in accordance with the present invention.

Referring to FIG. 2, the semiconductor chip test system of the present invention comprises a tester 20, a control circuit 22, a plurality of a semiconductor chips ((24-11~24-2m)~(24-n1~24-2nm)), and a probe card 26.

Symbols I/O11~I/O1k, I/O21~I/O2k, I/On1~I/Onk are indicative of data input/output lines connected between data input/output pins (not shown) of the tester 20 and the control circuit 22. Symbols ((I/O11~1k) 1~m, (I/O21~2k) 1~m, . . . , (I/On1~nk) 1~m) are indicative of data input/output lines connected between the control circuit 22 and data input/output pads (or pins) of the semiconductor chips ((24-11~24-1m), (24-21~24-2m), . . . (24-n1~24nm)) respectively. Symbols ADD and COM are indicative of address and command input lines connected between address and command input pins (not shown) of the tester 20 and address and command input pads (or pins) (not shown) of the control circuit 22 or the semiconductor chips ((24-11~24-1m), (24-21~24-2m), . . . (24-n1~24-nm)). A symbol POWER is indicative of power supply lines connected between power supplying pins (not shown) of the tester 20 and power supply input pads (or pins) (not shown) of the semiconductor chips ((24-11~24-1m), (24-21~24-2m), . . . (24-n1~24-nm)).

The tester 20 includes k data input/output pins (not shown) similar to those of the tester 10 shown in FIG. 1. The tester 20 inputs/outputs data through the data input/output lines I/O11~I/O1k, I/O21~I/O2k . . . I/On1~I/Onk and supplies the address, the command and the power supply to the semiconductor chips ((24-11~24-1m), (24-21~24-2m), . . . (24-n1~24-mn)) through the address and command output lines ADD and COM, and the power supply lines POWER.

The control circuit 22 inputs a command input through the command output lines COM and extends data input through n groups of k data input/output lines I/O11~I/O1k, I/O21~I/O2k . . . I/On1~I/Onk by m during a write operation. The extended data are applied to the n groups of the semiconductor chips ((24-11~24-1m), (24-21~24-2m), . . . (24-n1~24-nm)) having k data input/output pads (or pins) through the n groups of m data input/output lines each having k data input/output lines ((I/O11~I/O1k) 1~m, . . . , (I/On1~I/Onk) 1~m). Also, the control circuit 22 inputs a command input through the command output lines COM and inputs all of k data output from each of n groups of the semiconductor chips ((24-11~24-1m), (24-21~24-2m), . . . (24-n1~24-nm)) having k data input/output pads (or pins) during a read operation, and then sequentially outputs the data output from the first semiconductor chips (24-11~24-1m) to the $m_{th}$ semiconductor chips (24-n1~24-mn) of n groups of the semiconductor chips ((24-11~24-1m), (24-21~24-2m), . . . (24-n1~24nm)) through n groups of k data input/output lines ((I/O11~I/O1k)1~(I/On1 I/Onk)m) to the tester 20. In other words, the control circuit 22 extends the n groups of k data output from the tester 20 by m and simultaneously writes the extended data to the n groups of the semiconductor chips ((24-11~24-1m), (24-21~24-2m), . . . (24-n1~24nm)) during the write operation. Also, the control circuit 22 simultaneously inputs k data output from each of n groups of the semiconductor chips ((24-11~24-1m), (24-21~24-2m), . . . (24-n1~24nm)) during the read operation, and then sequentially outputs k data output from the first semiconductor chip (24-11~24-n1) to the $m_{th}$ semiconductor chip (24-1m~24-nm) of each of n groups of the semiconductor chips ((24-11~24-1m)~(24-n1~24-nm)) through n groups of k data input/output lines ((I/O11~1k)~(I/On1~nk)) to the tester 20. The data transfer between the control circuit 22 and the n groups of the semiconductor chips ((24-11~24-1m)~(24-n1~24-nm)) is performed through the probe card 26.

Consequently, an embodiment of semiconductor chip test system of the present invention of FIG. 2 can simultaneously test nm number of semiconductor chips having k data input/output pads (or pins) using the tester 20, wherein the number of the data input/output pins is nk.

Figure 3:
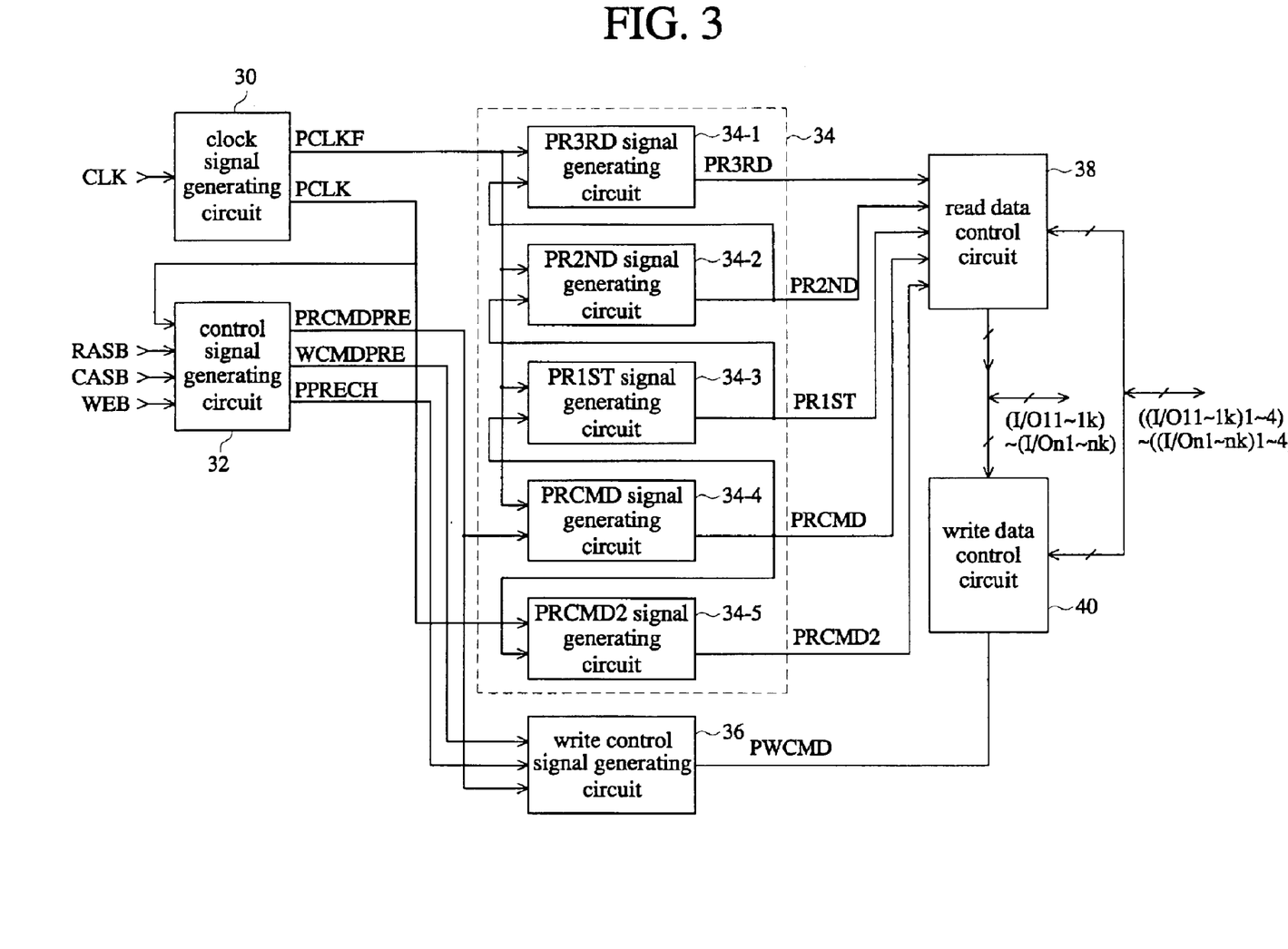
FIG. 3 is a block diagram illustrating an embodiment of a control circuit of the semiconductor chip test system of FIG. 2.

FIG. 3 is a block diagram of an embodiment of a control circuit of the semiconductor chip test system of FIG. 2. The control circuit includes a clock signal generating circuit 30, a control signal generating circuit 32, a read control signal generating circuit 34, a write control signal generating circuit 36, a read data control circuit 38, and a write data control circuit 40.

The read control signal generating circuit 34 includes a PR3RD signal generating circuit 34-1, a PR2ND signal generating circuit 34-2, a PR1ST signal generating circuit 34-3, a PRCMD signal generating circuit 34-4 and a PRCMD2 signal generating circuit 34-5.

The control circuit of the semiconductor chip test system of FIG. 3 inputs/outputs the input and output data through nk data input/output lines ((I/O11~1k)~(I/On1~nk)) over the data input/output lines (((I/O11~1k)1~4)~((I/On1~nk)1~4)).

Now, it will be explained in detailed to the operation for each of the blocks of FIG. 3 will be explained in detail.

The lock signal generating circuit 30 generates a clock signal PCLKF and PCLK in response to a clock signal CLK. The control signal generating circuit 32 inputs the clock signal PCLK, an inverted low address strobe signal RASB, a n inverted column address strobe signal CASB, and an inverted write enable signal WEB, to generate a read command PRCMDPRE, a write command WCMDPRE, and a precharge command PPRECH. The read control signal generating circuit 34 inputs the clock signal PCLKR and a read command PRCMDPRE to generate the read control signals PRCMD, PR1ST, PR2ND and PR3RD, and inputs the clock signal PCLK and the read control signal PRCMD to generate a latch timing control signal PRCMD2. The read control signals PRCMD, PR1ST, PR2ND and PR3RD are sequentially generated by being delayed by one clock cycle in response to the clock signal PCLK. The write control signal generating circuit 36 inputs the read command PRCMDPRE, the write command WCMDPRE, and the precharge command PPRECH to generate the write control signal PWCMD. The write data control circuit 40 extends data input from the data input/output lines ((I/O11~1k)~(I/On1~nk)) 4 times in response to the write control signal PWCMD and simultaneously outputs the extended data to the data input/output lines (((I/O11~1k)1~4)~((I/On1~nk)1~4)), during the write operation. The read data control circuit 38 simultaneously inputs the data input from the data input/output lines (((I/O11~1k)1~4)~((I/On1~nk)~1~4)) and sequentially outputs the data input from the data input/output lines (((I/O11~1k)1~4)~((I/On1~nk)1~4)) to the data input/output lines ((I/O11~1k)~(I/On1~nk)) in response to the read control signals PRCMD, PR1ST, PR2ND and PR3RD, and the latch timing control signal PRCMD2.

Figure 4:
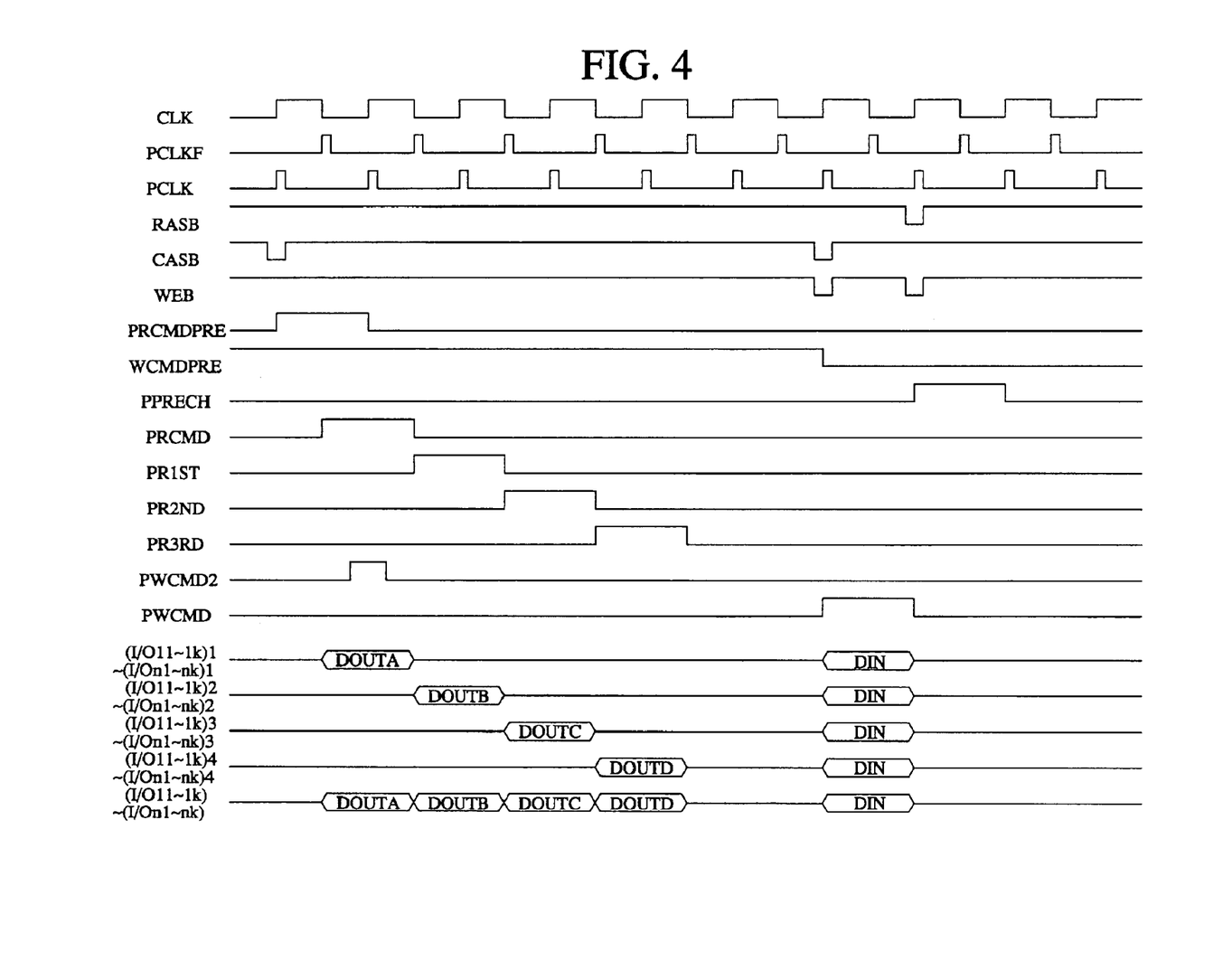
FIG. 4 is a timing chart for illustrating an operation of the control circuit of FIG. 3.

FIG. 4 is a timing chart for illustrating the operation of the control circuit of FIG. 3. The clock signal generating circuit 30 generates the clock signal PCLK by detecting a rising edge of the clock signal CLK, and generates the clock signal PCLKF by detecting a falling edge of the clock signal CLK.

Firstly, the operation for reading a test data will be explained.

When the inverted low address strobe signal RASB and the inverted write enable signal WEB of high level, and the inverted column address strobe signal CASB of low level are supplied to the control signal generating circuit 32, the control signal generating circuit 32 generates a read command PRCMDPRE in response to the clock signal PCLK.

When the read command PRCMDPRE is generated from the control signal generating circuit 32, the read control signal generating circuit 34 generates the read control signal PRCMD in response to the clock signal PCLKF, and generates the read control signals PR1ST, PR2ND and PR3RD by sequentially delaying the read control signal PRCMD in response to the clock signal PCLKF by the one clock cycle. Also, the read control signal generating circuit 34 generates the latch timing control signal PRCMD2 in response to the read control signal PRCMD and the clock signal PLCK. At this time, the generated signal PRCMD2 is used as a signal for correctly latching the data input through the data input/output lines (((I/O11~1k)1~4)~((I/On1~nk)1~4)).

The read data control circuit 38 outputs the data DOUTA input from the data input/output lines ((I/O11~1k)1~(I/On1~nk)1) to the data input/output lines ((I/O11~1k)~(I/On1~nk)) in response to the read control signal PRCMD. The read data control circuit 38 also latches data DOUTB, DOUTC, DOUTD input from the data input/output lines ((I/O11~1k)2~(I/On1~nk)4) in response to the latch timing control signal PRCMD2, outputs to the data input/output lines ((I/O11~1k)~(I/On1~nk)) the data DOUTB input from the data input/output lines ((I/O11~1k)2~(I/On1~nk)2) in response to the read control signal PR1ST, outputs to the data input/output lines ((I/O11~1k)~(I/On1~nk)) the data DOUTC input from the data input/output lines ((I/O11~1k)3~(I/On1~nk)3) in response to the read control signal PR2ND, and outputs to the data input/output lines ((I/O11~1k)~(I/On1~nk)) the data DOUTD input from the data input/output lines ((I/O11~1k)4~(I/On1~nk)4) in response to the read control signal PR3RD.

Next, the operation for writing the test data will be explained.

When the inverted low address strobe signal RASB of high level, the inverted write enable signal WEB and the inverted column address strobe signal CASB of low level are supplied to the control signal generating circuit 32, the control signal generating circuit 32 generates a write command WCMDPRE.

The write control signal generating circuit 36 generates the write control signal PWCMD in response to the write command WCMDPRE. Also, the write data control circuit 40 simultaneously outputs the data DIN input from the data input/output lines ((I/O11~1k)~(I/On1~nk)) to the data input/output lines ((I/O11~1k)1~4)~(I/On1~nk)1~4) in response to the write control signal PWCMD.

Next, when the inverted low address strobe signal RASB and the inverted write enable signal of low level, and the inverted column address strobe signal CASB of high level are supplied to the control signal generating circuit 32, the control signal generating circuit 32 generates the precharge command PPRECH.

When the precharge command PPRECH is generated by the control signal generating circuit 32, the write control signal generating circuit 36 disables the write control signal PWCMD.

Figure 5:
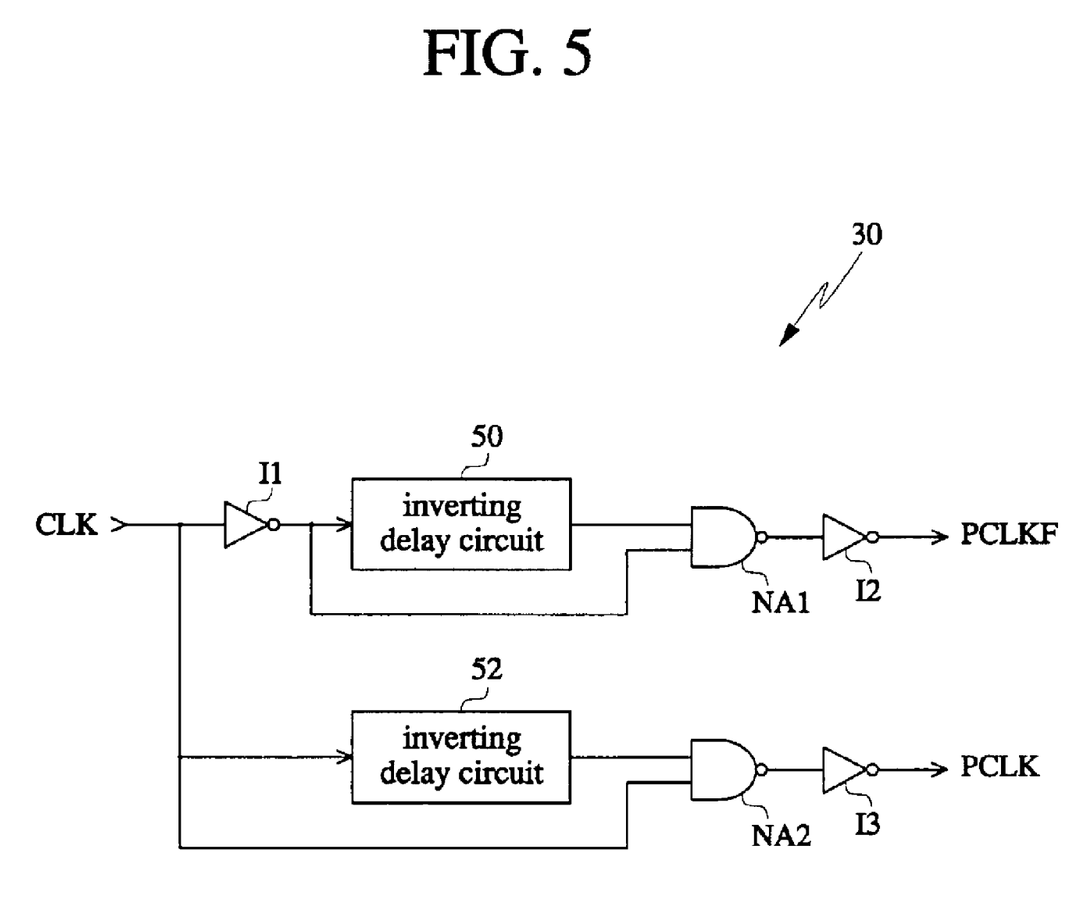
FIG. 5 is a circuit configuration of an embodiment of a clock signal generating circuit of FIG. 3.

FIG. 5 is a circuit configuration of an embodiment of the clock signal generating circuit 30 of FIG. 3. The clock signal generating circuit 30 is constituted of a clock signal PCLKF generating circuit including an inverting delay circuit 50, NAND gate NA1, and an inverters I1 and I2, and a clock signal PCLK generating circuit including an inverting delay circuit 52, a NAND gate NA2, and an inverter I3.

Next, the operation for each of the elements of the clock signal generating circuit 30 of FIG. 5 will be explained.

The inverter I1 inverts the clock signal CLK. The inverting delay circuit 50 inverts and delays an output signal of the inverter I1. The NAND gate NA1 NANDs the output signals of both the inverter I1 and the inverting delaying circuit 50. The inverter I2 inverts the output signal of the NAND gate NA1 to generate the clock signal PCLKF. The inverting delay circuit 52 inverts and delays the clock signal CLK. The NAND gate NA2 NANDs the output signal of the inverting delay circuit 52 and the clock signal CLK. The inverter I3 inverters the output signal of the NAND gate NA2 to generate the clock signal PCLK.

The clock signal generating circuit 30 shown in FIG. 5 generates the clock signal PCLKF in response to the falling edge of the clock signal CLK. At this time, the generated clock signal PCLKF has a pulse width of the delayed time of the inverting delay circuit 50. Also, the clock signal generating circuit generates the clock signal PCLK in response to the rising edge of the clock signal CLK. At this time, the generated clock signal PCLK has a pulse width of the delayed time of the inverting delay circuit 52.

Figure 6:
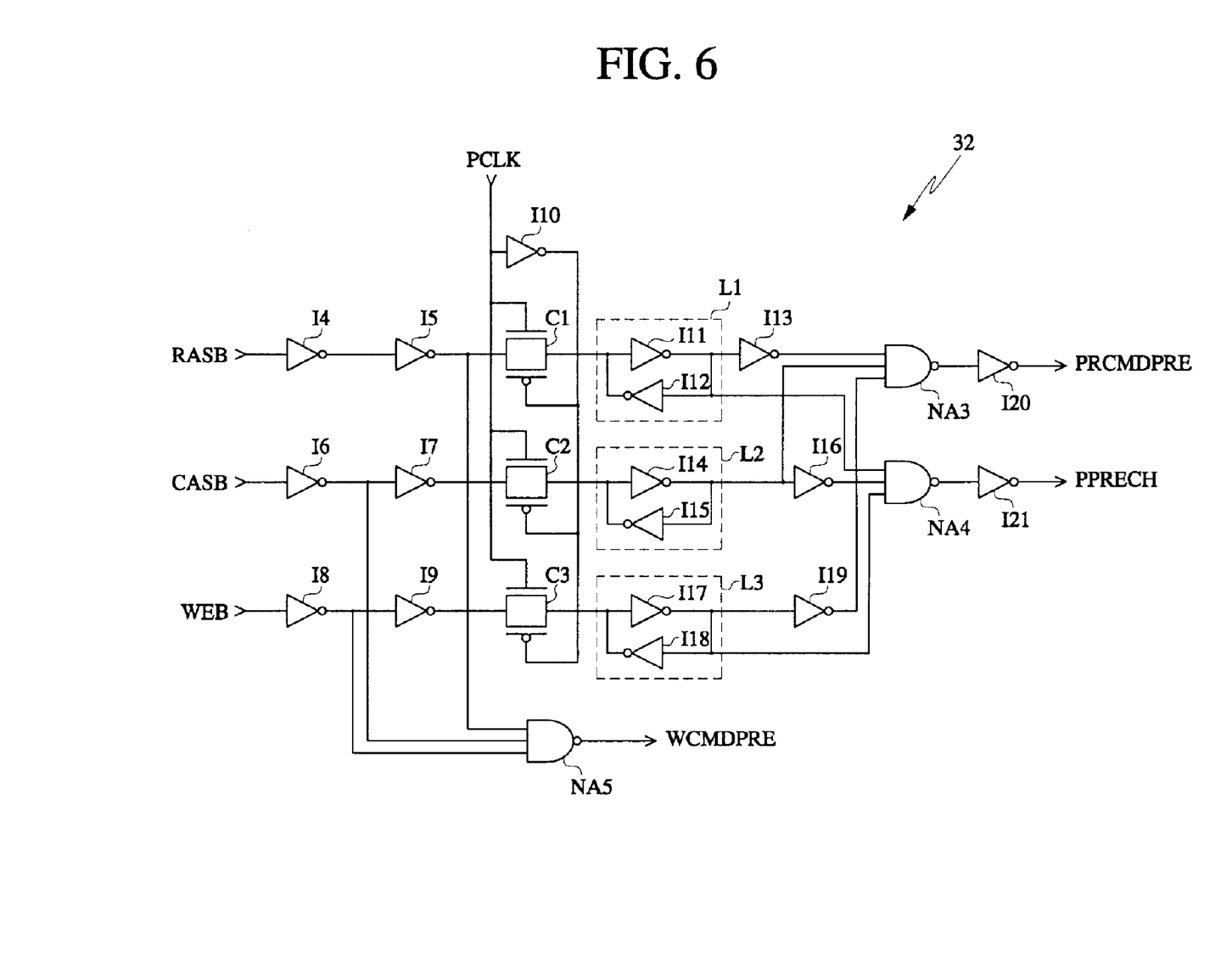
FIG. 6 is a circuit configuration of an embodiment of a control signal generating circuit of FIG. 3.

FIG. 6 is a circuit configuration of an embodiment of the control signal generating circuit 32 of FIG. 3. The control signal generating circuit 32 includes inverters I4~I21, CMOS transfer gates C1, C2 and C3, and NAND gates NA3, NA4, and NA5.

Referring to FIG. 6, the inverters I11 and I12 compose latch L1, the inverters I14 and I15 compose latch L2, and the inverters I17 and I18 compose latch L3.

Next, the operation of the elements shown in FIG. 6 will be explained.

The inverters I4 and I5 perform a buffering operation for the inverted low address strobe signal RASB. The inverters I6 and I7 perform the buffering operation for the inverted column address strobe signal CASB. The inverters I8 and I9 perform the buffering operation for the inverted write enable signal WEB. When the CMOS transfer gates C1, C2 and C3 are turned on in response to the clock signal PCLK of high level, the CMOS transfer gates transfer the output signals of the inverter I5, I7 and I9. The latches L1, L2 and L3 invert and latch the output signals of the CMOS transfer gates C1, C2 and C3. The inverters I11, I14 and I17 invert the output signals of the latch L1, L2 and L3 respectively. The NAND gate NA3 NANDs the output signal of the inverter I13, the output signal of the latch L2 and the output signal of the inverter I19. The inverter I20 inverts the output signal of the NAND gate NA3 to generate the read command PRCMD-PRE. The NAND gate NA4 NANDs the output signal of the latch L1, the output signal of the inverter I16 and the output signal of the latch L3. The inverter I21 inverts the output signal of the NAND gate NA4 to generate the precharge command PPRECH. The NAND gate NA5 NANDs the output signals of the inverter I5, I6, and I8 to generate the write command WCMDPRE.

That is, the control signal generating circuit 32 shown in FIG. 6, in response to the clock signal PCLK of high level, and latches the inverted low address strobe signal RASB, the inverted write enable signal WEB and the inverted column address strobe signal CASB by the latches L1, L2 and L3. At this time, when the signals latched by the latches L1, L2 and L3 are respectively at high level, low level and high level, the control signal generating circuit generates the read command PRCMDPRE. Also, when the signals latched by the latches L1, L2, and L3 are at low level, high level and low level, the control signal generating circuit generates the precharge command PPRECH. When the inverted low address strobe signal RASB of high level, the inverted write enable signal WEB and the inverted column address strobe signal CASB of low level, regardless of the state of the clock signal PCLK, are applied to the control signal generating circuit, the control signal generating circuit generates a write command WCMDPRE of high level.

Figure 7:
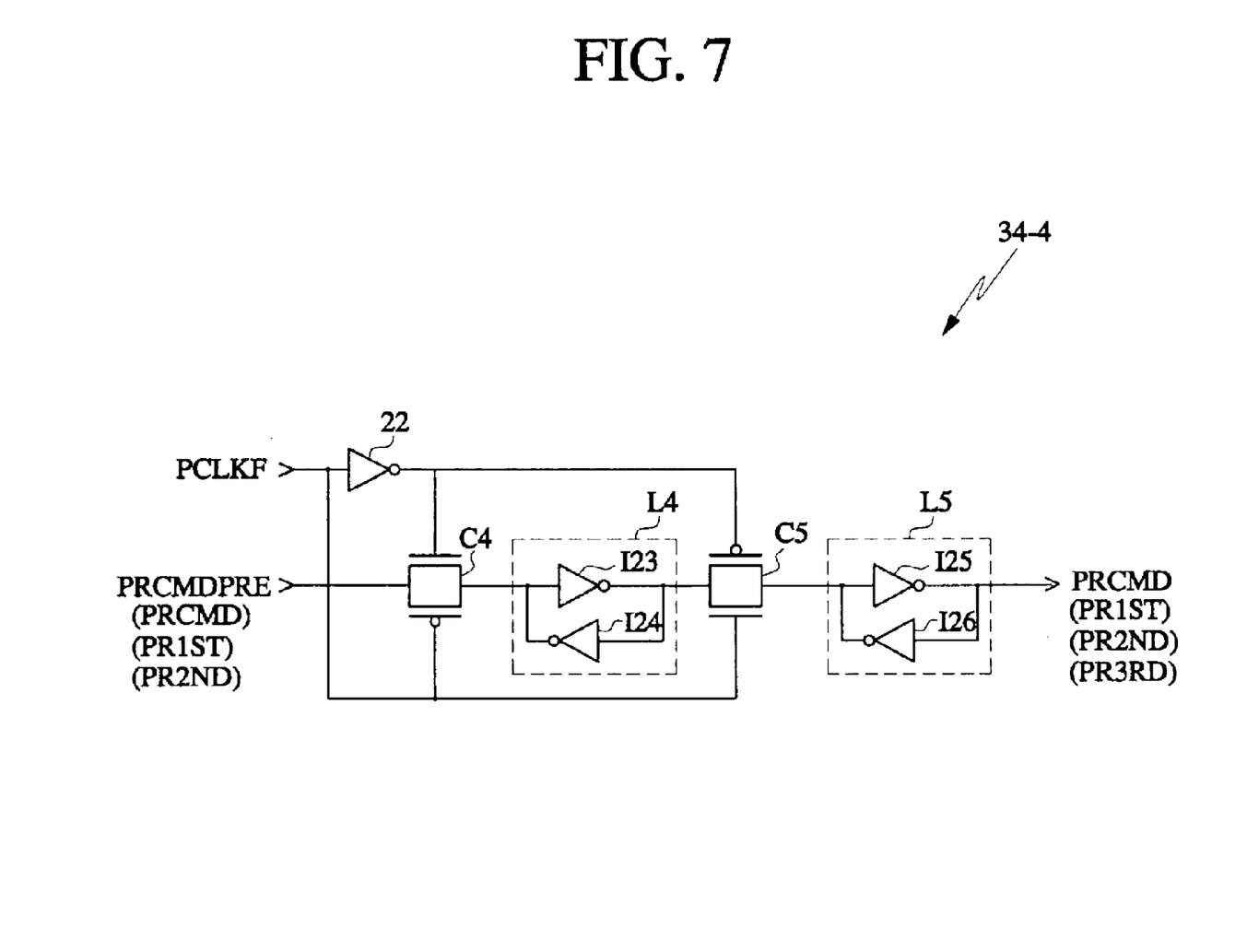
FIG. 7 is a circuit configuration of an embodiment of a signal generating circuit of a read control signal generating circuit of FIG. 3.

FIG. 7 is a circuit configuration of an embodiment of a PRCMD signal generating circuit 34-4 of the read control signal generating circuit shown in FIG. 3. The PRCMD signal generating circuit includes CMOS transfer gates C4 and C5, and inverters I22~I26.

Referring to FIG. 7, the inverters I23 and I24 compose the latch L4, and the inverters I25 and I26 compose the latch L5.

Next, the operation for the elements shown in FIG. 7 will be explained.

The CMOS transfer gate C4 transfers the read command PRCMDPRE in response to the clock signal PCLKF of high level. The latch L4 inverts and latches the output signal of the CMOS transfer gate C4. The CMOS transfer gate C5 transfers the output signal of the latch L4 in response to the clock signal PCLKF of high level. The latch L5 inverts and latches the output signal of the CMOS transfer gate C5 to generate the signal PRCMD.

The PRCMD signal generating circuit 34-4 shown in FIG. 7 latches the read command PRCMDPRE in response to the clock signal PCLKF of low level, and latches the latched signal in response to the clock signal PCLKF of high level, thereby generating the signal PRCMD.

PR1ST, PR2ND and PR3RD signal generating circuits are of the same configuration as the PRCMD signal generating circuit shown in FIG. 7.

In other words, the read control signal generating circuit delays the read command PRCMDPRE in response to the clock signal PCLKF to generate the read control signal PRCMD, delays the read control signal PRCMD by one clock cycle to generate the read control signal PR2ND, and delays the read control signal PR2ND by one clock cycle to generate the read control signal PR3RD.

Figure 8:
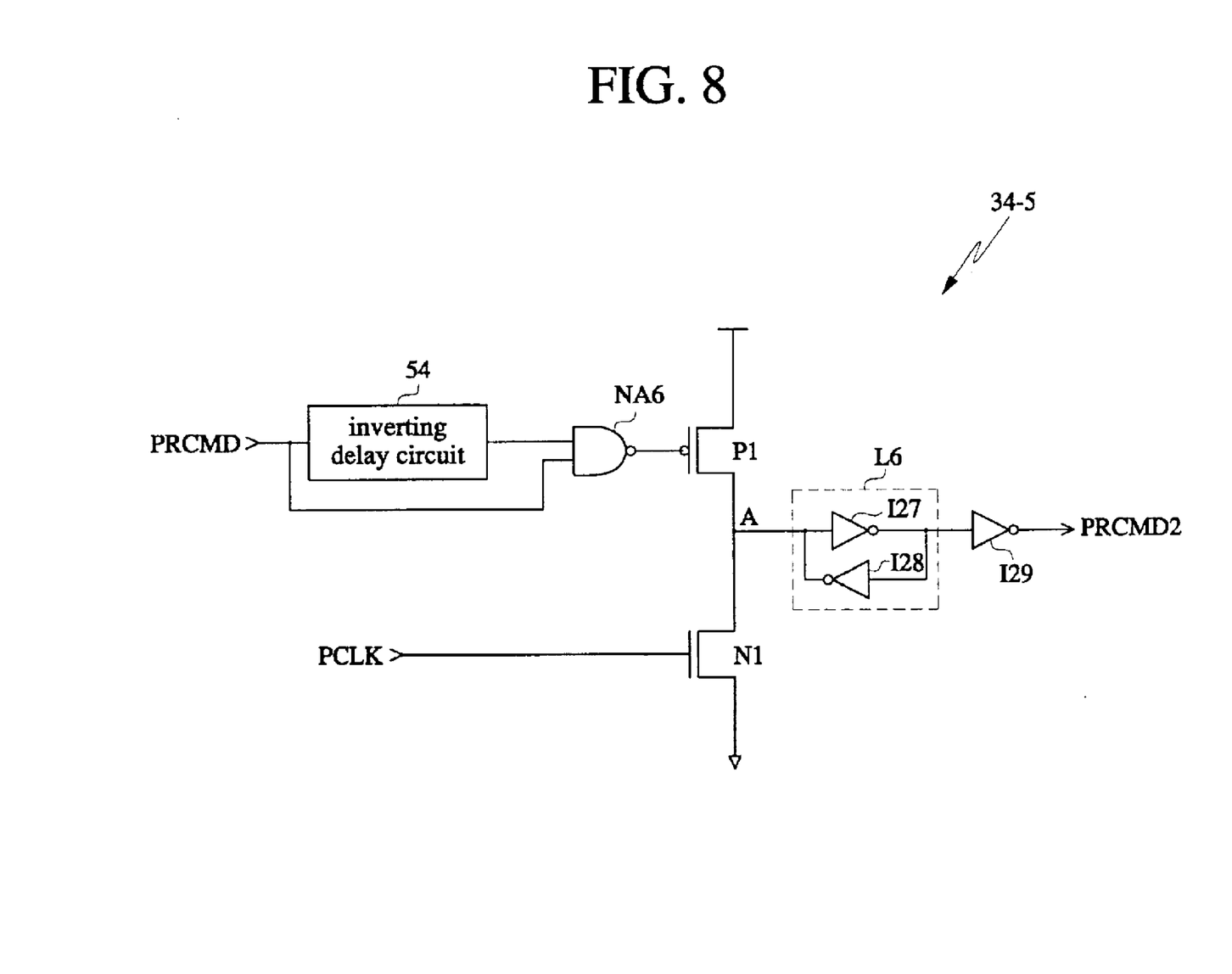
FIG. 8 is a circuit configuration of an embodiment of a signal generating circuit of the read control signal generating circuit of FIG. 3.

FIG. 8 is a circuit configuration of an embodiment of the PRCMD2 signal generating circuit 34-5 of the read control signal generating circuit 34 shown in FIG. 3. The PRCMD2 signal generating circuit 34-5 includes inverting delay circuit 54, NAND gate NA6, PMOS transistor P1, NMOS transistor N1, and inverters I27, I28 and I29.

Referring to FIG. 8, the inverters I27 and I28 compose latch L6.

Next, the operation for the elements shown in FIG. 8 will be explained.

The inverting delay circuit 54 inverts and delays the read control signal PRCMD. The NAND gate NA6 NANDs the output signal of the inverting delay circuit 54 and the read control signal PRCMD. The PMOS transistor P1 makes the node A transition to high level in response to the output signal of the NAND gate NA6 of low level. The NMOS transistor N1 makes the node A transition to low level in response to the clock signal PCLK of high level. The latch L6 inverts and latches the signal of the node A. The inverter I29 inverts the output signal of the latch L6 to generate the latch timing control signal PRCMD2.

The PRCMD2 signal generating circuit shown in FIG. 8 generates the latch timing control signal PRCMD2 transitioning to high level in response to a rising edge of the read control signal PRCMD and transitioning to low level in response to the clock signal PCLK of high level.

Figure 9:
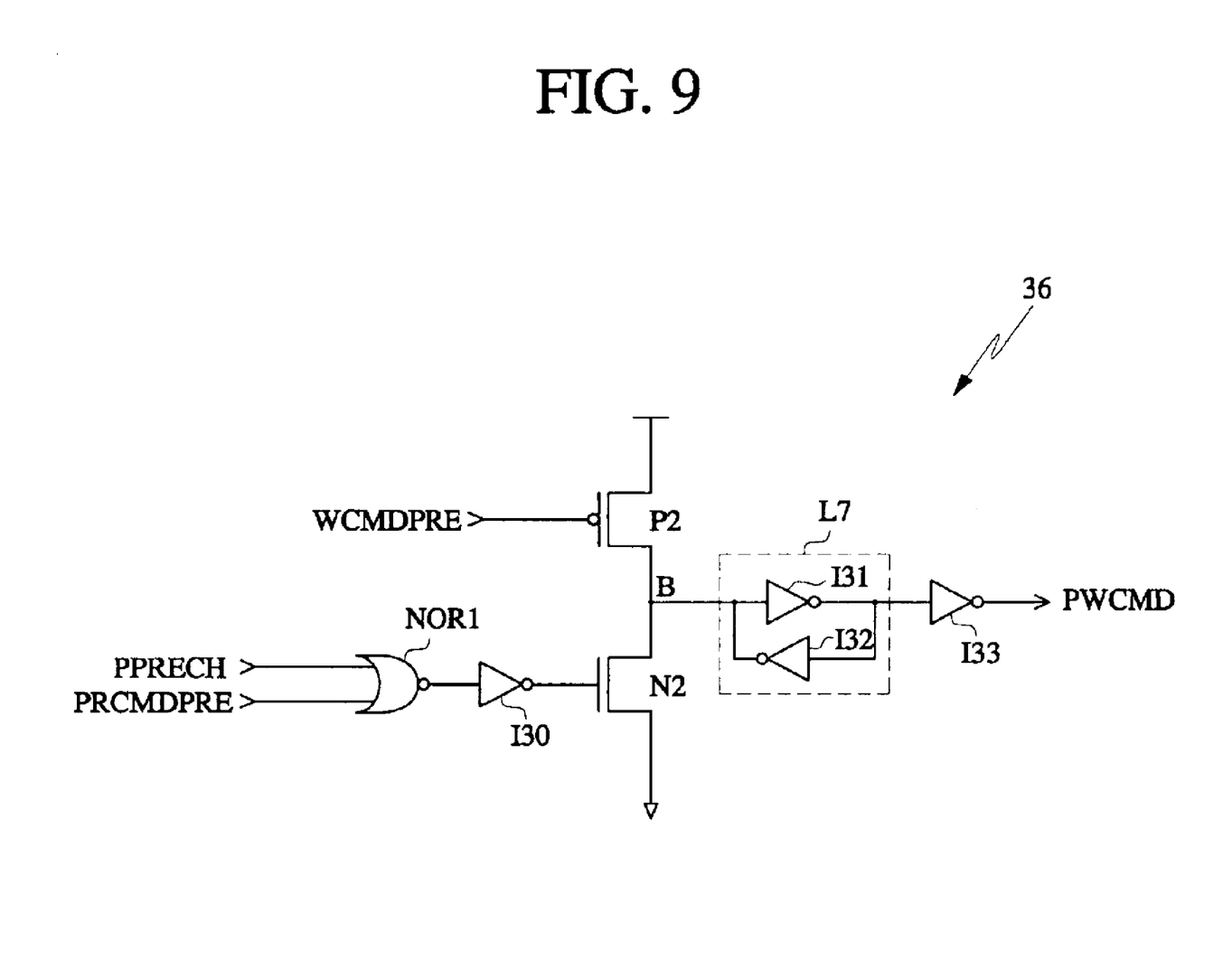
FIG. 9 is a circuit configuration of an embodiment of a write control signal generating circuit of FIG. 3.

FIG. 9 is a circuit configuration of an embodiment of the write control signal generating circuit 36 of FIG. 3. The write control signal generating circuit 36 includes the NOR gate NOR1, inverters I30, I31, I32 and I33, the PMOS transistor P2, and the NMOS transistor N2.

Referring to FIG. 9, the inverters I31, I32 compose latch L7.

Next, the operation for the elements shown in FIG. 9 will be explained.

The NOR gate NOR1 NORs the precharge command PPRECH and the read command PRCHMDPRE. The inverter I30 inverts the output signal of the NOR gate NOR1. A circuit constituted of the NOR gate NOR1 and the inverter I30 generates a high level signal, when the precharge command PPRECH of high level or the read command PRCMDPRE of high level are input to the circuit. The PMOS transistor P2 is turned on in response to the write command WCMDPRE of low level, and makes the node B transition to high level. The NMOS transistor N2 is turned on in response to the output signal of the inverter I30 of high level, and makes the node B transition to low level. The latch L7 inverts and latches the signal of the node B. The inverter I33 inverts the output signal of the latch L7 to generate the write control signal PWCMD.

When the precharge command PPRECH or the read command PRCMDPRE of high level are supplied to the write control signal generating circuit 36, the write control generating circuit generates the write control signal PWCMD of low level. Also, when the write command WCMDPRE of low level is supplied to the write control signal generating circuit 36, the write control generating circuit generates the write control signal PWCMD of high level.

Figure 10:
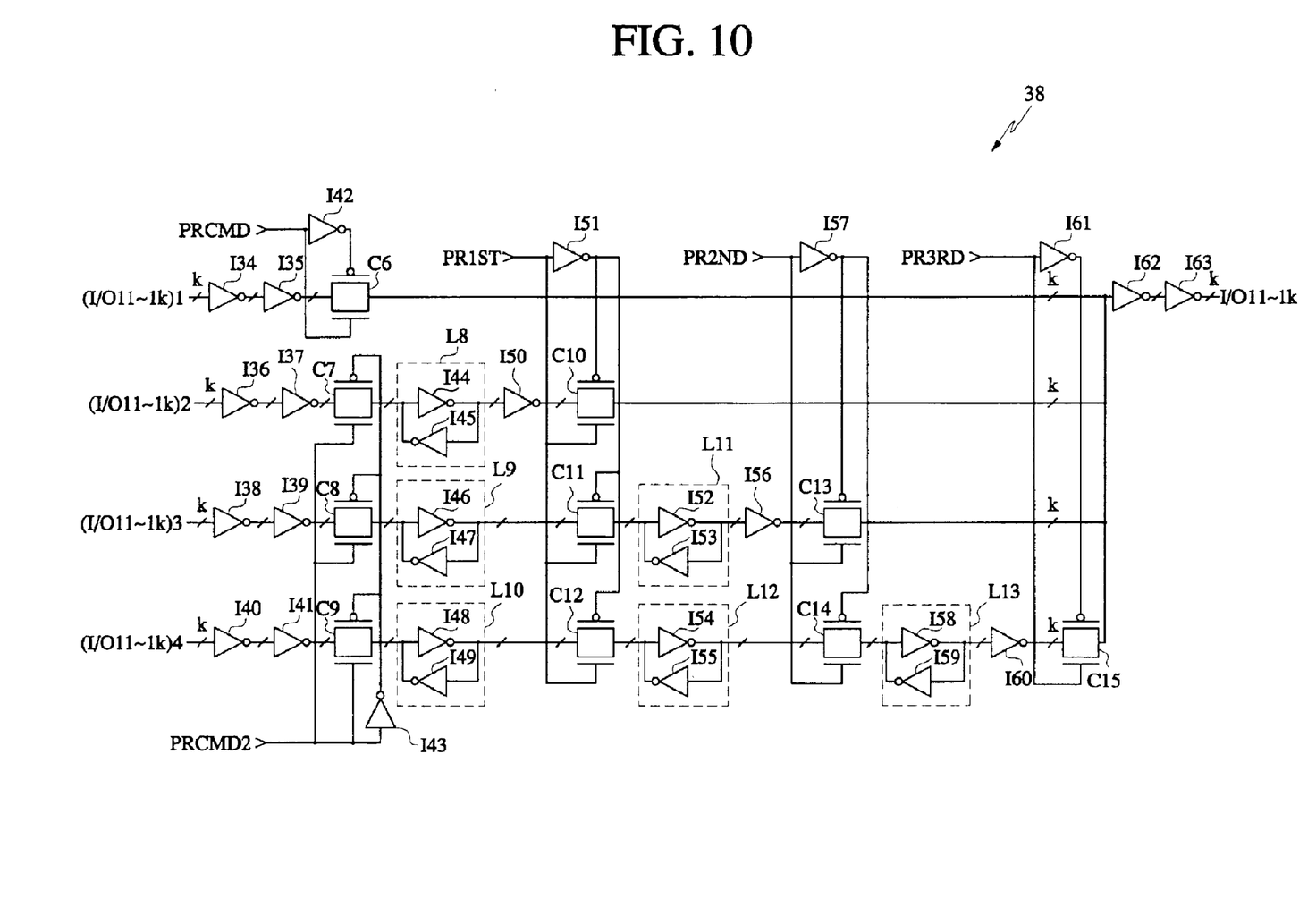
FIG. 10 is a circuit configuration of an embodiment of a read data control circuit of FIG. 3.

FIG. 10 is a circuit configuration of an embodiment of the read data control circuit 38 of FIG. 3. The read data control circuit includes inverters I34~I63, and CMOS transfer gates C6~C15.

Referring to FIG. 10, the inverters I44 and I45 compose latch L8. The inverters I46 and I47 compose latch L9. The inverters I48 and I49 compose latch L10. Also, the inverters I52 and I53 compose latch L11, the inverters I54 and I55 compose latch L12, and the inverters I58 and I59 compose latch L13.

FIG. 10 shows a circuit for outputting the data input from the data input/output lines ((I/O11~1k)1~4) through the data input/output lines (I/O11~1k). A circuit (not shown) for outputting the data input from the data input/output lines ((I/O21~2k)1~4)~((I/On1~nk)1~4) through the data input/output lines ((I/O21~2k)~(I/On1~nk)) is of the same configuration as that of FIG. 10.

Next, the operation for the elements of FIG. 10 will be explained.

The inverters (I34, I35), (I36, I37), (I38, I39), and (I40, I41) buffer the data input through each of k data input/output lines (I/O11~1k)1~4. The CMOS transfer gate C6 transfers the output signal of the inverter I35 in response to the read control signal PRCMD of high level. The CMOS transfer gates C7, C8 and C9 respectively transfer the output signals of the inverters I37, I39 and I41 in response to the latch timing control signal PRCMD2 of high level. The latches L8, L9 and L10 respectively invert and latch the output signals of the CMOS transfer gates C7, C8 and C9. The inverter I50 inverts the output signal of the latch L8. The CMOS transfer gates C10, C11 and C12 respectively transfer the output signals of the inverter I50 and the latches L9 and L10 in response to the read control signal PR1ST of high level. The latches L11 and L12 respectively invert and latch the output signals of the CMOS transfer gates C11 and C12. The inverter I56 inverts the output signal of the latch L11. The CMOS transfer gates C13 and C14 respectively transfer the output signals of the inverter I56 and the latch L12 in response to the read control signal PR2ND of high level. The latch L13 inverts and latches the output signal of the CMOS transfer gate C14. The inverter I60 inverts the output signal of the latch L13. The CMOS transfer gate C15 transfers the output signal of the inverter I58 in response to the read control signal PR3RD of high level. The inverters I62 and I63 respectively perform a buffering operation for the signal output from the CMOS transfer gates C6, C10, C13 and transfer the buffered signal to the data input/output lines I/O11~1k.

In other words, the read data control circuit 38 shown in FIG. 10 transfers the data transferred from the data input/output lines ((I/O11~1k)1)) to the data input/output lines (I/O11~1k) in response to the read control signal PRCMD, latches the data transferred from the data input/output lines ((I/O11~1k)2)) in response to the latch timing control signal PRCMD2, and transfers the latched data to the data input/output lines (I/O11~1k) in response to the read control signal PR1ST. Accordingly, the data transferred from the data input/output lines ((I/O11~1k)2)) is transferred to the data input/output lines (I/O11~1k) one clock cycle later after the data transferred from the data input/output lines ((I/O11~1k) 1)) is transferred to the data input/output lines (I/O11~1k). Also, the data transferred from the data input/output lines ((I/O11~1k)3)) is transferred to the data input/output lines (I/O11~1k) one clock cycle after the data transferred from the data input/output lines ((I/O11~1k)2)) is transferred to the data input/output lines (I/O11~1k). Similarly, the data transferred from the data input/output lines ((I/O11~1k)4)) is transferred to the data input/output lines (1/O11~1k) one clock cycle after the data transferred from the data input/output lines ((I/O11~1k)3)) is transferred to the data input/output lines (I/O11~1k).

Figure 11:
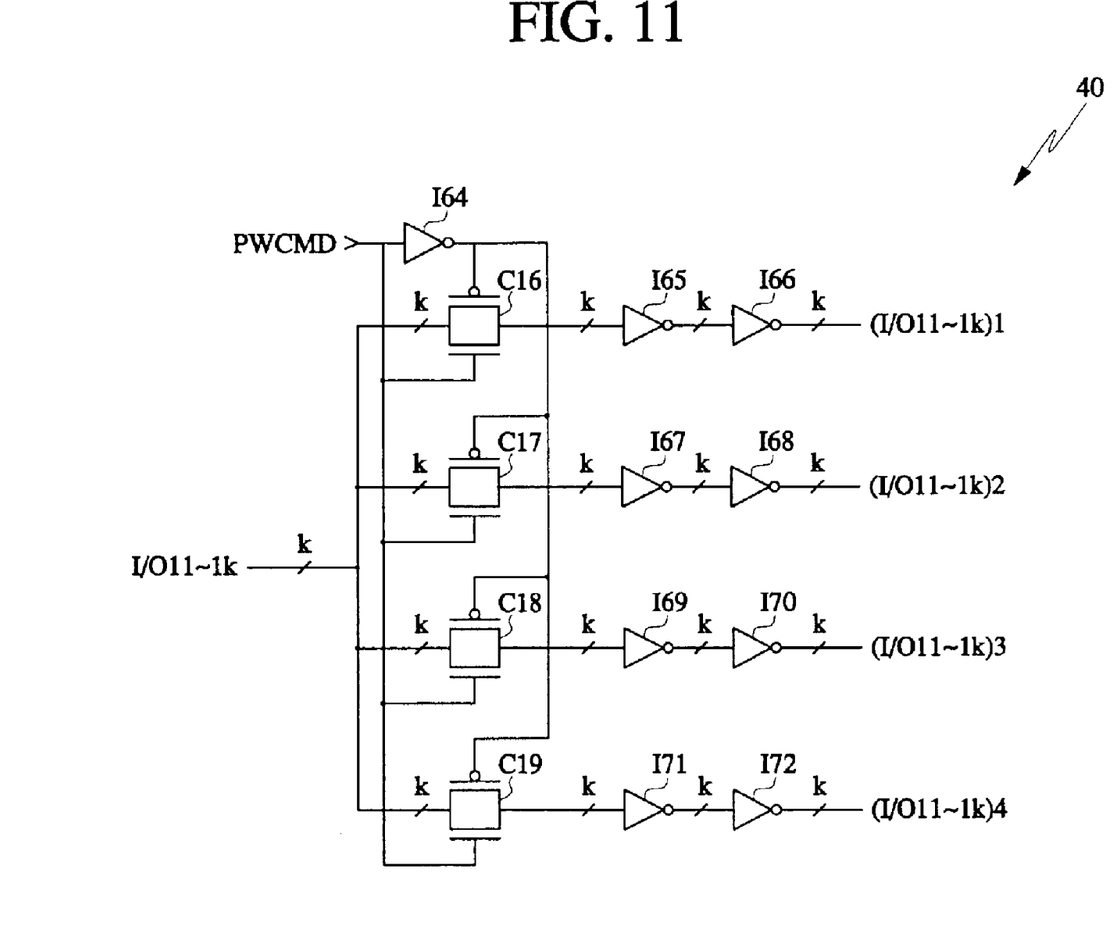
FIG. 11 is a circuit configuration of an embodiment of a write data control circuit of FIG. 3.

FIG. 11 is a circuit configuration of an embodiment of the write data control circuit 40 shown in FIG. 3. The write data control circuit 40 includes inverters I64~I72, and CMOS transfer gates C16~C19.

FIG. 11 shows a circuit for outputting through the data input/output lines ((I/O11~1k)1~4) the data input through the data input/output lines (I/O11~1k). A circuit (not shown) for outputting the data input from the data input/output lines ((I/O21~2k)~(I/On1~nk) to the data input/output lines ((I/O21~2k)1~4)~((I/On1~nk)1~4) is of the same configuration as that of FIG. 11.

Next, the operation for the elements shown in FIG. 11 will be explained.

The CMOS transfer gates C16~C19 respectively transfer the data input from the data input/output lines (I/O11~1k) in response to the write control signal PWCMD of high level. The inverters (I65, I66), (I67, I68), (I69, I70), and (I71, I72) respectively perform a buffering operation for the data output from the CMOS transfer gates C16~C19 and then output the buffered data to the data input/output lines ((I/O11~1k)1~4).

In other words, the write data control circuit 40 shown in FIG. 11 simultaneously outputs the data input from the data input/output lines (I/O11~1k) in response to the write control signal PWCMD to the data input/output lines ((I/O11~1k)1~4)).

As described above, the control circuit according to an embodiment of the present invention uses the latch timing control signal PRCMD2 for correctly latching the data, but may be constituted of latching the data with read control signals without using the latch timing control signal PRCMD2.

Further, the control circuit of the present invention may be incorporated in the probe card, and may be also incorporated separately between the tester and the probe card.

Accordingly, the semiconductor chip test system and test method thereof can simultaneously test many semiconductor chips regardless of the number of data input/output pads(or, pins).

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor chip test system, comprising:
a tester having a plurality of data input/output pins for inputting/outputting data through the plurality of data input/output pins;
a plurality of semiconductor chips to be tested by the tester; and
a control circuit for sequentially outputting the data output from each of the plurality of semiconductor chips to the tester during a read operation and supplying the data input from the tester to the plurality of semiconductor chips during a write operation, wherein the control circuit, comprises:
a clock signal generating means for generating a first clock signal in response to a rising edge of a clock signal input from the tester and generating a second clock signal in response to a falling edge of the clock signal input from the tester;
a control signal generating means for generating a read command and a write command by inputting a command input from the tester;
a read control signal generating means for sequentially generating a plurality of a read control signals in response to the read command and the second clock signal;
a write control signal generating means for generating a write control signal in response to the write command;
a read data control means for sequentially outputting the output data from each of the plurality of semiconductor chips in response to the plurality of read control signals to the tester; and
a write data control means for simultaneously outputting the data input from the tester to the plurality of semiconductor chips in response to the write control signal.

2. A semiconductor chip test system, comprising:
a tester having n groups of data input/output pins of which each of the groups include k data input/output pins for inputting/outputting data through the plurality of data input/output pins;
n groups of semiconductor chips, each group including m semiconductor chips, each semiconductor chip comprising k data input/output pads (or pins) to be tested by the tester; and
a control means for sequentially outputting the data input from a first one to $m_{th}$ one of each of the n groups of semiconductor chips to the tester during a read operation and simultaneously supplying nk data output from the tester to the n groups of semiconductor chips during a write operation, wherein the control means, comprises:
a clock signal generating means for generating a first clock signal in response to a rising edge of a clock signal input from the tester and generating a second clock signal in response to a falling edge of the clock signal input from the tester;
a control signal generating means for generating a read command and a write command by inputting a command input from the tester;
a read control signal generating means for sequentially generating m read control signals by inputting the read command in response to the second clock signal;
a write control signal generating means for generating a write control signal in response to the write command;
a read data control means for sequentially outputting the output data from a first semiconductor chip to the $m_{th}$ semiconductor chip of each of the n groups of semiconductor chips to the tester in response to the m read control signals; and
a write data control means for simultaneously outputting the data input from the tester to the n groups of semiconductor chips in response to the write control signal.

3. The semiconductor chip test system according to claim 2, wherein the control signal generating means, comprises:
a read command generating circuit for generating the read command in response to the first clock signal, when an inverted low address strobe signal of high level, an inverted write enable signal of high level, and an inverted column address strobe signal of low level are supplied to the control signal generating means; and
a write command generating circuit for generating the write command in response to the first clock signal, when the inverted low address strobe signal of high level, the inverted column address strobe signal of low level, and the inverted write enable signal of low level are supplied to the control signal generating means.

4. The semiconductor chip test system according to claim 3, wherein the control signal generating means further comprises:
a precharge command generating circuit for generating a precharge command in response to the first clock signal, when the inverted low address strobe signal of low level, the inverted write enable signal of low level, and the inverted column address strobe signal of high level are supplied to the control signal generating means.

5. The semiconductor chip test system according to claim 2, wherein the read control signal generating means, comprises:
a read control signal generating circuit for sequentially generating a first read control signal in response to the second clock signal, when the read command is generated, and sequentially generating $2_{nd}$-$m_{th}$ read control signals by sequentially delaying the first read control signal by one clock cycle, in response to the second clock signal, when the first read control signal is generated; and a latch timing control signal generating circuit for generating a latch timing control signal by inputting the read control signal and the first clock signal.

6. The semiconductor chip test system according to claim 5, wherein the read data control means, comprises:

a first read data generating circuit for outputting the output data from a first semiconductor chip for each of the n groups of semiconductor chips to the tester; and a second read data generating circuit for latching the output data from a second semiconductor chip of each of the n groups of semiconductor chips in response to the latch timing control signal, and sequentially outputting the output data from the second semiconductor chip to the $m_{th}$ semiconductor chip of each of the n groups of semiconductor chips in response to each of the $2_{nd}$-$m_{th}$ read control signals to the tester.

7. The semiconductor chip test system according to claim 2, wherein the write control signal generating means generates the write control signal according to the generation of the write command, and disables the write control signal according to the generation of the read command or the precharge command.

8. A semiconductor test method for a semiconductor chip test system, the system including a tester having n groups of data input/output pins of which each of the groups include k data input/output pins for inputting/outputting data through the data input/output pins; and n groups of semiconductor chips being respectively including m semiconductor chips, and each of the m semiconductor chips comprising k data input/output pads (or pins) to be tested by the tester, comprising steps of:

sequentially outputting the input data from a first semiconductor chip to $m_{th}$ semiconductor chip for each of the n groups of the semiconductor chips to the tester during a read operation; and simultaneously supplying nk data output from the tester to the n groups of semiconductor chips during a write operation, wherein the test method further comprises steps of:

generating a first clock signal in response to a rising edge of a clock signal input from the tester, generating a second clock signal in response to a falling edge of the clock signal from the tester, and generating a read command and a write command by inputting a command input from the tester;

generating sequentially m read control signals by inputting the read command in response to the second clock signal, and generating a write control signal in response to the write command; and outputting sequentially output data from the first semiconductor chip to the $m_{th}$ semiconductor chip for each of the n groups of semiconductor chips to the tester in response to each of the m read control signals during the read operation and simultaneously outputting the data input from the tester to the n groups of semiconductor chips in response to the write control signal during the write operation.

9. The semiconductor test method according to claim 8, wherein the step for generating the read command and write command comprises steps of:

generating the write command in response to the first clock signal, when the inverted low address strobe signal of high level, the inverted column address strobe signal of low level, and the inverted write enable signal of low level are supplied from the tester; and generating the read command in response to the first clock signal, when the inverted low address strobe signal of high level, the inverted column address strobe signal of low level, and the inverted write enable signal of high level are supplied from the tester.

10. The semiconductor test method according to claim 8, wherein the step for generating the read and write control signals comprises steps of:

generating a first read control signal in response to the second clock signal, when the read command is generated, sequentially generating $2_{nd}$-$m_{th}$ read control signals that are delayed by one clock cycle from the first read control signal in response to the second clock signal, when the first read control signal is generated, and generating the latch timing control signal by inputting the read control signal and the first clock signal; and generating the write control signal in accordance with generation of the write command, and disabling the write control signal in accordance with generation of the read command or the precharge command.

11. The semiconductor test method according to claim 8, wherein the step for controlling the read data, comprises:

outputting the output data from a first semiconductor chip for each of n groups of semiconductor chips to the tester in response to the first read control signal; and latching the output data from a second semiconductor chip for each of n groups of semiconductor chips in response to the latch timing control signal, and sequentially outputting the output data from the second semiconductor chip to the $m_{th}$ semiconductor chip for each of the n groups of semiconductor chips in response to each of the $2_{nd}$-$m_{th}$ read control signals to the tester.

* * * * *